United States Patent [19]

Fukushima

[11] Patent Number: 5,668,819
[45] Date of Patent: Sep. 16, 1997

[54] MASK CONTROL DEVICE FOR LSI TESTER

[75] Inventor: Takeo Fukushima, Tokyo, Japan

[73] Assignee: Ando Electric Co., Ltd., Tokyo, Japan

[21] Appl. No.: 668,228

[22] Filed: Jun. 21, 1996

[30] Foreign Application Priority Data

Jun. 29, 1995 [JP] Japan ................................ 7-186440

[51] Int. Cl.$^6$ ...................................................... G01R 31/28
[52] U.S. Cl. .................. 371/25.1; 371/27.2; 395/182.01
[58] Field of Search ........................... 371/25.1, 27, 22.1, 371/21.1, 21.3, 24, 21.2; 324/73 R, 765; 395/421.07, 182.01; 364/717

[56] References Cited

U.S. PATENT DOCUMENTS

| | | | |
|---|---|---|---|
| 4,313,200 | 1/1982 | Nishiura | 371/25 |
| 4,369,511 | 1/1983 | Kimura et al. | 371/21 |
| 4,807,229 | 2/1989 | Tada | 371/27 |
| 4,835,774 | 5/1989 | Ooshima et al. | 371/25 |
| 5,170,398 | 12/1992 | Fujieda et al. | 371/27 |
| 5,321,641 | 6/1994 | Ohkubo | 364/717 |
| 5,432,797 | 7/1995 | Takano | 371/27 |
| 5,481,549 | 1/1996 | Tokuyama | 371/27 |

*Primary Examiner*—Robert W. Beausoliel, Jr.
*Assistant Examiner*—Nadeem Iqbal
*Attorney, Agent, or Firm*—Finnegan, Henderson, Farabow, Garrett & Dunner, L.L.P.

[57] ABSTRACT

A mask control device is disclosed comprising an address generator which generates a random pattern address, a serial pattern address, and a pattern mode signal. Random pattern memories store random pattern expected and mask waveform data to be used for a random pattern test. Serial pattern memories store serial pattern expected and mask waveform data to be used for a serial pattern test. First and second pin selectors arrange the serial pattern expected and mask waveform data to generate serial pattern expected and mask waveform data corresponding to tester pins and generate serial mode designating signals designating pins to which the serial pattern test is to be applied. A selector selects the random pattern expected waveform data or the serial pattern expected waveform data generated by the first pin selector based on the serial mode designating signals. A comparator compares output waveform data obtained from the device under test (DUT) with the waveform data from the selector. A logic operation circuit generates select signals based on the serial mode designating signal and the serial pattern mask waveform data from the second pin selector, and modulates the random pattern mask waveform data based on the select signal to generate mask waveform data. A mask control circuit carries out mask control using the mask waveform data generated by the logic operating circuit on the comparison result of the comparator.

2 Claims, 9 Drawing Sheets

FIG.2A

| RANDOM ADDRESS | RANDOM PATTERN DATA | | ADDRESS GENERATION CONTROL COMMAND |
|---|---|---|---|
| | EXPECTED DATA | MASK DATA | |
| 0 | 'H' | NO MASK | NO CONTROL |
| 1 | 'L' | NO MASK | NO CONTROL |
| 2 | 'H' | MASK | NO CONTROL |
| 3 | 'L' | MASK | LSSD OPERATION SERIAL START ADDRESS 0~3 |
| 4 | 'H' | NO MASK | END |

←——— ONE PIN ———→

FIG.2B

| SERIAL ADDRESS | SERIAL PATTERN DATA | |
|---|---|---|
| | EXPECTED DATA | MASK DATA |
| 0 | 'H' | NO MASK |
| 1 | 'L' | MASK |
| 2 | 'L' | NO MASK |
| 3 | 'H' | MASK |

←——— ONE BIT ———→

FIG.7A

| RANDOM ADDRESS | RANDOM PATTERN DATA | | ADDRESS GENERATION CONTROL COMMAND |
|---|---|---|---|
| | EXPECTED DATA | MASK DATA | |
| 0 | 'H' | NO MASK | NO CONTROL |
| 1 | 'L' | NO MASK | NO CONTROL |
| 2 | 'H' | MASK | NO CONTROL |
| 3 | 'L' | NO MASK | LSSD OPERATION SERIAL START ADDRESS 0~3 |
| 4 | 'H' | NO MASK | END |

ONE PIN

FIG.7B

| SERIAL ADDRESS | SERIAL PATTERN DATA | |
|---|---|---|
| | EXPECTED DATA | MASK DATA |
| 0 | 'H' | NO MASK |
| 1 | 'L' | MASK |
| 2 | 'L' | NO MASK |
| 3 | 'H' | MASK |

ONE BIT

MASK CONTROL DEVICE FOR LSI TESTER

BACKGROUND OF THE INVENTION

1. Field of the Invention

The present invention relates to mask control devices for controlling mask functions of LSI (Large Scaled Integrated circuit) testers, which can carry out a function test of LSIs designed according to an LSSD (Level Sensitive Scan Designing) rule.

2. Background Art

When testing logic functions of LSIs designed according to LSSD rules, a function test including a random pattern test and a serial pattern test is carried out on the LSIs by an LSI tester.

In the random pattern test, random pattern input waveform data are supplied to input terminals of a DUT (Device Under Test). Random pattern output waveform data are then obtained from output terminals of the DUT and the waveform data thus obtained are then compared with random pattern expected waveform data which are previously stored in a memory of the LSI tester.

In the serial pattern test, input waveform data are supplied to the DUT so that a shift register is formed by flip-flops which are internal circuit elements of the DUT, and data shift operation is carried out by the shift register. Serial pattern output waveform data are then obtained from one or more specified output terminals of the DUT as a result of the data shift operation. The serial pattern output waveform data thus obtained are compared with serial pattern expected waveform data which are previously stored in a memory of the LSI tester.

In the above tests, if the logical function of the DUT has no defect, the output waveform data obtained from the DUT are in accord with the expected waveform data. Therefore, the correctness of the logical function can be judged by comparing the output waveform data with the expected waveform data.

However, there are cases in which the expected waveform data cannot be determined or are not necessary with respect to a part of the output waveform data. In such a case, it is necessary to control the LSI tester so that the comparison result regarding such output waveform data are not used for judging the correctness of the logic function of the DUT. In order to carry out this control, a mask control device is employed in LSI testers.

FIG. 5 is a block diagram showing the configuration of a conventional mask control device.

As shown in FIG. 5, an address generator 11 can selectively generate either one of a random pattern address or a serial pattern address. Furthermore, the address generator 11 can generate a pattern mode signal indicating which test is to be carried out, a random pattern test or a serial pattern test.

The random pattern address (referred to as "random address" hereinbelow) is supplied to n expected waveform random pattern memories $12_1$–$12_n$ and n mask waveform random pattern memories $13_1$–$13_n$.

The serial pattern address (referred to as "serial address" hereinbelow) is supplied to m expected waveform serial pattern memories $14_1$–$14_m$ and m mask waveform serial pattern memories $15_1$–$15_n$.

The expected waveform random pattern memories $12_1$–$12_n$ store n random pattern expected waveform data to be used for the random pattern test. The LSI tester has n tester pins, some of which are connected to terminals of the DUT. The n random pattern waveform data stored in the memories $12_1$–$12_n$ respectively correspond to the tester pins 1–n.

The mask waveform random pattern memories $13_1$–$13_n$ store n random pattern mask waveform data which respectively correspond to the random pattern expected waveform data stored in the memories $12_1$–$12_n$ and are to be used for the random pattern test.

In the random pattern test, the output waveform data obtained from the output terminals of the DUT are inputted to some tester pins of the LSI tester and the output waveform data thus inputted are compared with the random pattern expected waveform data. The random pattern mask waveform data are used for a mask control when judging the correctness of the logical function of the DUT based on the results of the comparison.

More specifically, if random pattern mask waveform data, at a random address corresponding to a pin k, designates "mask", the comparison result corresponding to the pin obtained at the random address is not used for the judgement. If random pattern mask waveform data, at a random address corresponding to a pin k, designates "no mask", the comparison result corresponding to the pin at the random address is used for the judgement.

The expected waveform serial pattern memories $14_1$–$14_m$ store m serial pattern expected waveform data which are to be used for the serial pattern test.

The mask waveform serial pattern memories $15_1$–$15_m$ store m serial pattern mask waveform data corresponding to the m serial pattern expected waveform data.

In the serial pattern test, the serial pattern output waveform data obtained from the specified output terminals of the DUT are inputted to one or more tester pins of the LSI tester and the serial pattern output waveform data thus inputted are compared with the serial pattern expected waveform data. The serial pattern mask waveform data are used for a mask control when judging the correctness of the logical function of the DUT based on the results of the comparison.

Serial pattern expected waveform data $SO_1$–$SO_m$ read out from the expected waveform serial pattern memories $14_1$–$14_m$ are supplied to a pin selector 16. The pin selector 16 has n output terminals for outputting n bits serial pattern expected waveform data corresponding to the pins 1–n of the LSI tester and the pin selector stores select data designating the pins to which the m bits of the serial pattern expected waveform data are to be assigned. The select data are previously programmed by an external CPU (not shown in the figure). In this pin selector 16, a pin assigning operation is carried out on the m bits of the serial pattern expected waveform data based on the select data and the results are outputted as n bits serial pattern expected waveform data $PSO_1$–$PSO_n$ corresponding to the pins 1–n.

Serial pattern mask waveform data $SM_1$–$SM_m$ read out from the mask waveform serial pattern memories $15_1$–$15_m$ are supplied to a pin selector 17. The pin selector 17 also has n output terminals for outputting n bits serial pattern mask waveform data corresponding to the pins 1–n and the pin selector stores select data designating the pins to which the m bits of the serial pattern mask waveform data are respectively to be assigned. In this pin selector 17, a pin assigning operation which is the same as that of the pin selector 16 is carried out on the m bits serial pattern mask waveform data based on the select data and the results are outputted as n bits serial pattern mask waveform data $PSM_1$–$PSM_n$ corresponding to the pins 1–n.

The pin selectors 16 and 17 receive the pattern mode signal. The pin assigning operation described above is carried out when a serial pattern test is designated by the pattern mode signal.

Furthermore, the pin selector 16 has a function for outputting serial mode designating signals $SP_1$–$SP_n$ corresponding to the pins 1–n during the serial pattern mode.

FIG. 6 shows an example of the pin selector 16. This pin selector 16 has register groups $R_1$–$R_n$ which respectively correspond to the pins 1–n. Each one of the register groups $R_i$ (i=1–n) stores m bits select data which is programmed by the external CPU. The m bits select data stored in the register group $R_i$ are respectively supplied to AND gates $AND_{i1}$–$AND_{im}$ and an OR gate $OR_i$. The output data of the OR gate $OR_i$ is supplied to an AND gate $AND_{iO}$ corresponding to the pin i.

The serial pattern expected waveform data $SO_1$–$SO_m$ are respectively supplied to the first input terminals of the AND gates $AND_{i1}$–$AND_{im}$ corresponding to the pin i. On the other hand, the m select data stored in the register group $R_i$ are respectively supplied to the second input terminals of the AND gates $AND_{i1}$–$AND_{im}$. The AND gates $AND_{i1}$–$AND_{im}$ select the serial pattern expected waveform data $SO_1$–$SO_m$ according to the m select data supplied thereto and the selected result as the serial pattern expected waveform data $PSO_i$.

The AND gates $AND_{iO}$ (i=1–n) receive the pattern mode signal. Each AND gate $AND_i$ outputs a serial mode designating signal $SP_i$ when the pattern mode signal indicating the serial pattern test is received and the data "H" is outputted by the OR gate $OR_i$.

The configuration of the pin selector 17 is basically the same as that of the pin selector 16 but the pin selector 17 does not have the line for transmitting the pattern mode signal as shown in FIG. 6. Because the serial pattern mask waveform data $SM_1$–$SM_m$ respectively correspond to the serial pattern expected waveform data $SO_1$–$SO_m$. If the pin selector 17 has a function for outputting the serial mode designating signals like the pin selector 16, the same serial mode designating signals may be outputted from the pin selectors 16 and 17 in most cases. Therefore, the function for outputting the serial mode designating signals is omitted in the pin selector 17.

In FIG. 5, the random pattern expected waveform data $PO_1$–$PO_n$ which are read out from the expected waveform random pattern memories $12_1$–$12_n$ are supplied to an input port A of a selector 18. On the other hand, the serial pattern expected waveform data $PS_1$–$PS_n$ corresponding to the pins 1–n are supplied from the pin selector 16 to an input port B of the selector 18. The input data of the input port A or the input data of the input port B are selected by the selector based on the serial mode designating signals $SP_1$–$SP_n$, and the selected data are outputted from the output terminal Q. The output data of the selector 18 are supplied to an input port A of a comparator 20 and thereby compared with the output data of the DUT which are inputted via an input port B.

The random pattern mask waveform data $PM_1$–$PM_n$ read out from the mask waveform random pattern memories $13_1$–$13_n$ are supplied to an input port A of a selector 19. On the other hand, the serial pattern mask waveform data $PSM_1$–$PSM_n$ outputted by the pin selector 17 are supplied to an input port B of the selector 19. The input data of the input port A or the input data of the input port B are selected by the selector based on the serial mode setting signals $SP_1$–$SP_n$ and the selected data are outputted from the output terminal Q.

The output data of the selector 19 are supplied to a mask control circuit 21. The mask control circuit 21 masks the results of the comparison obtained from the comparator 20 based on the mask waveform data outputted from the selector 19.

FIGS. 7A and 7B shows an example of a waveform data and a command used for a function test of a DUT which is designed according to a LSSD rule. FIG. 8 shows an operation in which the waveform data read out from the random pattern memories and the serial pattern memories in the function test. FIG. 9 is a time chart showing the operation of the mask control device executing the function test. The operation of the mask control device will be described with reference to these drawings.

FIG. 7A shows the random pattern expected waveform data, and the random pattern mask waveform data, and the address generation control command at the random addresses (0)–(4) which are programmed in the random pattern memories $12_1$ and $13_1$.

In FIG. 7A, the random pattern expected waveform data at the random address (0) is "H" and the random pattern mask waveform data at the random address (0) is "no mask" which means that the comparison result regarding the waveform data is not to be masked. The address generation control command at the random address (0) is "no control" which means that no address control is required.

At the random address (1), the expected waveform data is "L", and the mask waveform data is "no mask", and the address generation control command is "no control".

At the random address (2), the expected waveform data is "H", and the mask waveform data is "mask" which means that the comparison result regarding the expected waveform data is to be masked, and the address generation control command is "no control".

At the random address (3), the expected waveform data is "L", and the mask waveform data is "no mask", and the address generation control command designates that the LSSD operation is to be carried out and the loop start address is to be set to (0)–(3).

At the random address (4), the expected waveform data is "H", and the mask waveform data is "no mask", and the address generation control command designates the end of the test.

On the other hand, FIG. 7B shows the serial pattern expected waveform data and the serial pattern mask waveform data corresponding to the serial addresses (0)–(4) which are programmed in the serial pattern memories $14_1$ and $15_1$.

In this example, at the serial address (0), the expected waveform data is "H", the mask waveform data is "no mask". At the serial address (1), the expected waveform data is "L", and the mask waveform is "mask". At the serial address (2), the expected waveform data is "L", and the mask waveform data is "mask". At the serial address (3), the expected waveform data is "H", and the mask waveform data is "mask".

FIG. 8 shows the random pattern memories $12_1$–$12_n$ and $13_1$–$13_n$, and the serial pattern memories $14_1$–$14_m$ and $15_1$–$15_m$, in some of which the waveform data described above are stored.

In this example, the select data are set in the pin selectors 16 and 17 so that the serial pattern waveform data $SO_1$ and $SM_1$ shown in FIG. 7B are assigned to the pin 1, for example.

The reason the pin selectors 16 and 17 are provided at the output stage of the serial pattern waveform data is as follows:

The number of the bits of the serial pattern waveform data $SO_1$-$SO_m$ and $SM_1$-$SM_m$ does not always correspond to that of the random pattern waveform data $PO_1$-$PO_n$ and $PM_1$-$PM_n$. In most cases, the relationship of m>n or m<n exists. Therefore, the pin selectors 16 and 17 are provided to control the bit positions of the n bits output data at which the m bits serial data are outputted.

When the function test of a DUT starts, the random address, and the serial address, and the pattern mode signal are generated by the address generator 11 in real time, for example, as shown in FIG. 9.

In the example shown in FIG. 9, the pattern mode signal designating a random pattern mode is outputted by the address generator 11 while the random addresses (0)–(2) are sequentially outputted.

In this period, the random addresses (0)–(2) are sequentially supplied to the random pattern memories $12_1$-$12_n$ and $13_1$-$13_n$ which respectively store the random pattern expected waveform data and the random pattern mask waveform data as shown in FIG. 8. As a result, the random pattern expected and mask waveform data corresponding to the random address (0)–(2) are sequentially read out from the random pattern memories, and the data thus read out are supplied to the pin selectors 18 and Since the pattern mode signal designates the random pattern mode, no serial mode designating signal is outputted by the pin selector 16. Therefore, the random pattern expected and mask waveform data from the random pattern memories are supplied to the comparator 20 and the mask control circuit 21.

Next, the pattern mode signal is changed so as to designate the serial pattern mode. While the pattern mode signal is designating the serial pattern mode, the serial addresses (0)–(3) are sequentially supplied from the address generator 11 to the expected waveform serial pattern memories $14_1$-$14_m$ and the mask waveform serial pattern memories $15_1$-$15_m$ which respectively store the serial pattern expected waveform data and the serial pattern mask waveform data as shown in FIG. 8. On the other hand, the random address supplied to the random pattern memories are fixed to (3) during the serial pattern mode.

During the serial pattern mode, the serial pattern expected and mask waveform data corresponding to the serial addresses (0)–(3) are sequentially read out from the serial pattern memories and the data thus read out are supplied to the pin selectors 16 and 17.

In each pin selector, each bit of the waveform data is assigned to a pin designated by the select data and the result of this pin assigning operation is outputted as the n bits serial waveform data $PSO_1$-$PSO_n$ or $PSM_1$-$PSM_n$ which corresponds to the assigned pin. The serial waveform data $PSO_1$-$PSO_n$ or $PSM_1$-$PSM_n$ are supplied to the selectors 18 and 19.

In this example, the select data are set in the pin selectors 16 and 17 so that the serial pattern waveform data $SO_1$ and $SM_1$ shown in FIG. 7B are assigned to the pin 1 as described above. Therefore, the serial pattern waveform data are outputted as the serial pattern expected and mask waveform data $PSO_1$ and $PSM_1$.

In selectors 18 and 19, the random pattern expected and mask waveform data or the serial pattern expected and mask waveform data are selected based on the serial mode designating signals $SP_1$-$SP_n$ corresponding to the pins 1–n.

More specifically, when a serial mode designating signal $SP_k$ is "H", the serial pattern expected and mask waveform data are selected by the selectors for the pin k. When a serial mode designating signal $SP_k$ is "L", the random pattern expected and mask waveform data are selected by the selectors for the pin k.

In this example, since the serial pattern expected and mask waveform data corresponding to the pin 1 are outputted from the pin selectors 16 and 17, the serial mode designating signal $SP_1$ corresponding to the pin 1 and having the level "H" is supplied from the pin selector 16 to the selectors 18 and 19. Therefore, the serial pattern expected and mask waveform data are selected by the selectors 18 and 19 for the pin 1.

The n bits expected waveform data selected by the selector 18 may include the serial pattern expected waveform data corresponding to the specified pins (in this case, the pin 1) and the random pattern expected waveform data corresponding to the other pins. The expected waveform data thus selected are supplied to the comparator 20.

The n bits mask waveform data selected by the selector 19 may include the serial pattern mask waveform data corresponding to the specified pins (in this case, the pin 1) and the random pattern mask waveform data corresponding to the other pins. The mask waveform data thus selected are supplied to the mask control circuit 21.

The mask control is then carried out on the comparison results of the comparator 20 by the mask control circuit 21 based on the mask waveform data supplied from the selector 19.

Meanwhile, the conventional mask control device requires three signal interfaces for transmitting the serial pattern expected waveform data, and the serial pattern mask waveform data, and the serial mode designating signals in order to supply the serial pattern expected and mask waveform data to the comparator and the mask control circuit. Thus, the conventional mask control device has problems in that the scale of the device is large and the configuration of the device is complex. The shrinkage and simplification are required with respect to the mask control device.

SUMMARY OF THE INVENTION

Accordingly, It is an object of the present invention to provide a mask control device which can carry out a mask control for a function test of a DUT designed according to a LSSD rule and has a small scale and simple configuration.

In an aspect of the present invention, there is provided a mask control device comprising an address generator for generating a random pattern address, a serial pattern address and a pattern mode signal, and an expected waveform random pattern memory for storing random pattern expected waveform data which designate expected waveform data to be outputted from a DUT in a random pattern test, and a mask waveform random pattern memory for storing random pattern mask waveform data which are to be used for the random pattern test, and an expected waveform serial pattern memory for storing serial pattern expected waveform data which designate expected waveform data to be outputted from the DUT in a serial pattern test, and a mask waveform serial pattern memory for storing serial pattern mask waveform data which are to be used for the serial pattern test, and a first pin selector for arranging the serial pattern expected waveform data to generate serial pattern expected waveform data corresponding to tester pins and for generating serial mode designating signals designating pins to which the serial pattern test is to be applied, and a second pin selector for arranging the serial pattern mask waveform data to generate serial pattern mask waveform data corresponding to the tester pins, and a selector for selecting the random pattern expected waveform data or the serial pattern expected waveform data generated by the first pin selector based on the serial mode designating signals, and a comparator for comparing output waveform data obtained from the DUT with the random pattern expected waveform data or the serial pattern expected waveform data which are selected by the selector, and a logic operation circuit for generating select signals based on the serial mode designating signal and the serial pattern mask waveform data from the second pin selector, and for modulating the random pattern mask waveform data based on the select signal to generate mask waveform data, and a mask control circuit for carrying out mask control using the mask waveform data generated by the logic operating circuit on the comparison result of the comparator.

BRIEF DESCRIPTION OF THE DRAWINGS

FIGS. 2A and 2B shows an example of a waveform data which is used for a function test of a DUT which is designed according to a LSSD rule.

FIGS. 7A and 7B shows an example of a waveform data which is used for a function test of a DUT which is designed according to a LSSD rule.

DETAILED DESCRIPTION OF THE PREFERRED EMBODIMENTS

Figure 1:
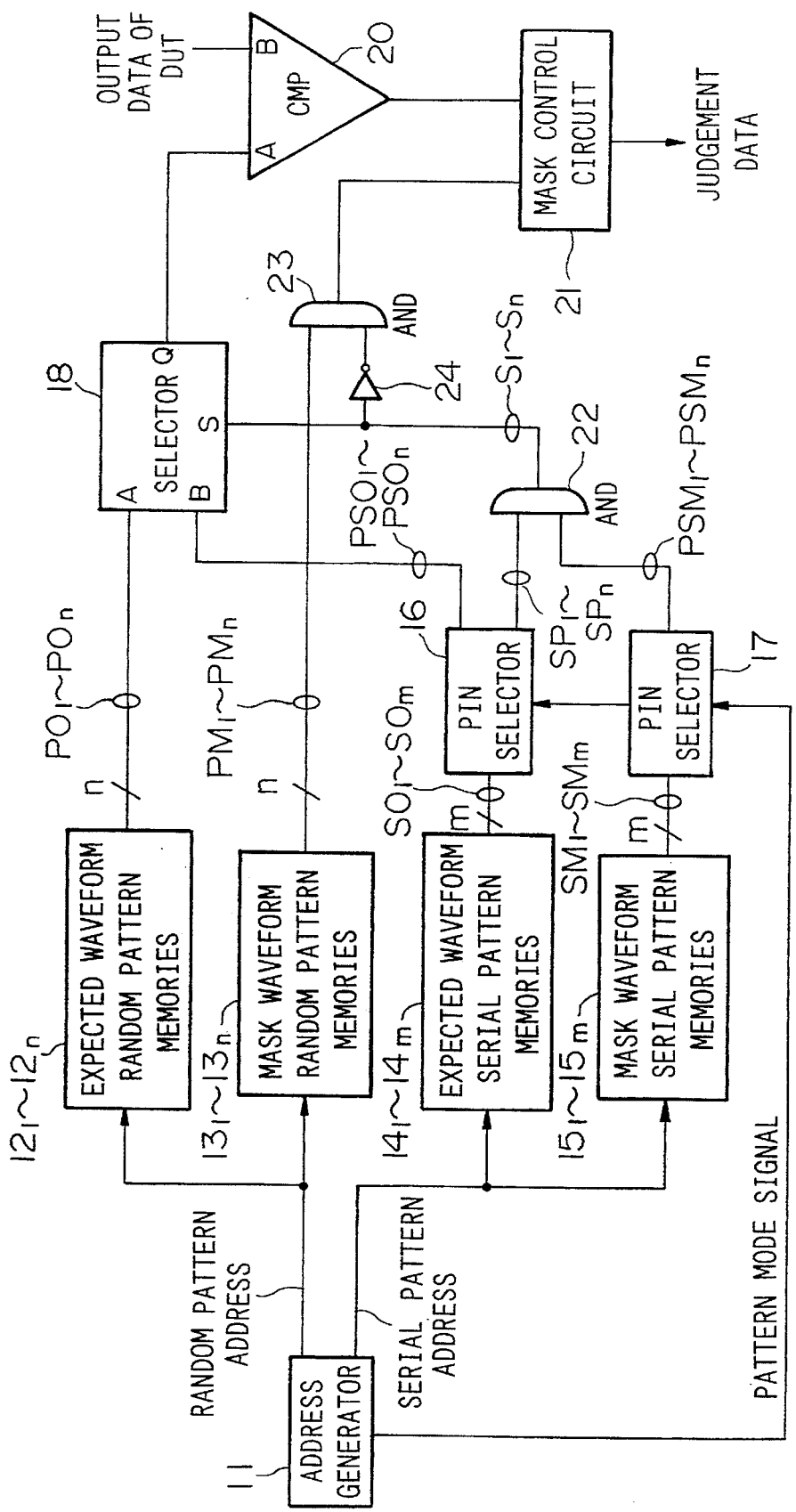
FIG. 1 is a block diagram showing the configuration of a mask control device according to a preferred embodiment of the present invention.

FIG. 1 is a block diagram showing the overall structure of a mask control device according to a preferred embodiment of the present invention. The members which are identical to those of the conventional mask control device shown in FIG. 5 are designated by the same reference numerals as of the generator, and the description thereof will therefore be omitted.

In FIG. 1, an AND gate 22 is provided to generate select signals $S_1$–$S_n$ which are the logical products of the serial pattern mask waveform data $PSM_1$–$PSM_n$ supplied via the pin selector 17 and the serial mode designating signals $SP_1$–$SP_n$ generated by the pin selector 17.

Figure 5:
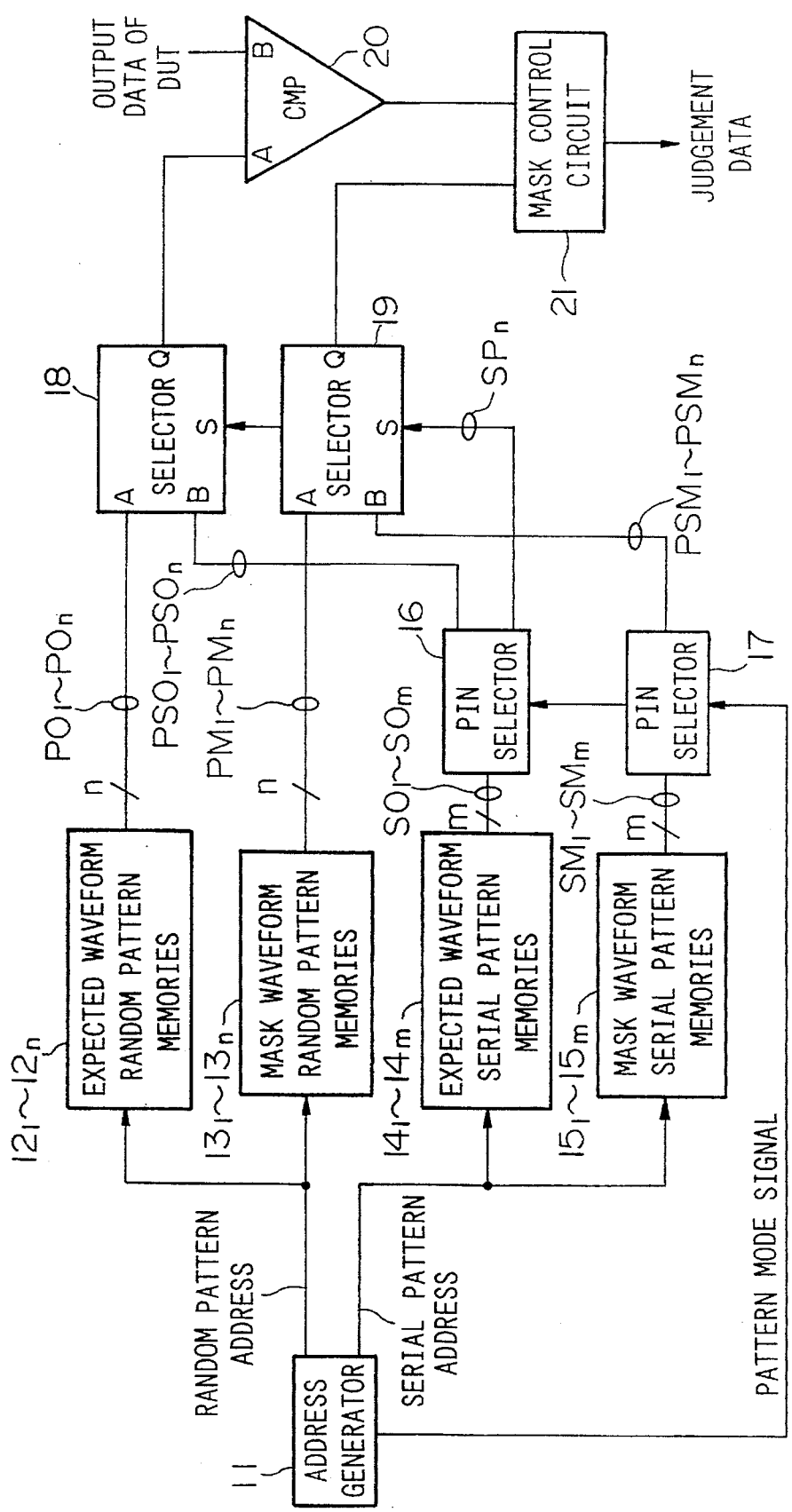
FIG. 5 is a block diagram showing the configuration of a conventional mask control device.
Figure 6:
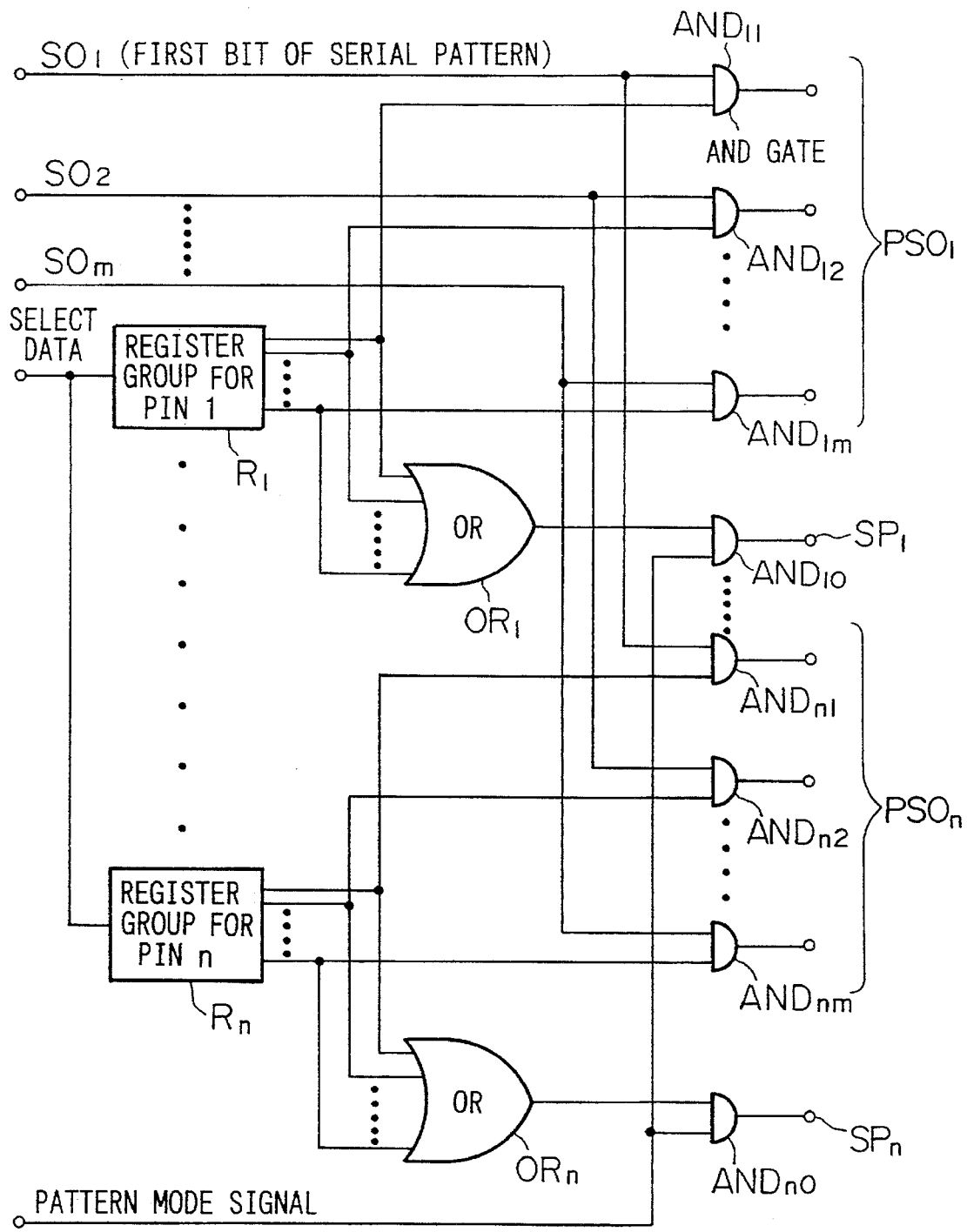
FIG. 6 shows an example of a pin selector employed in the mask control device.
Figure 8:
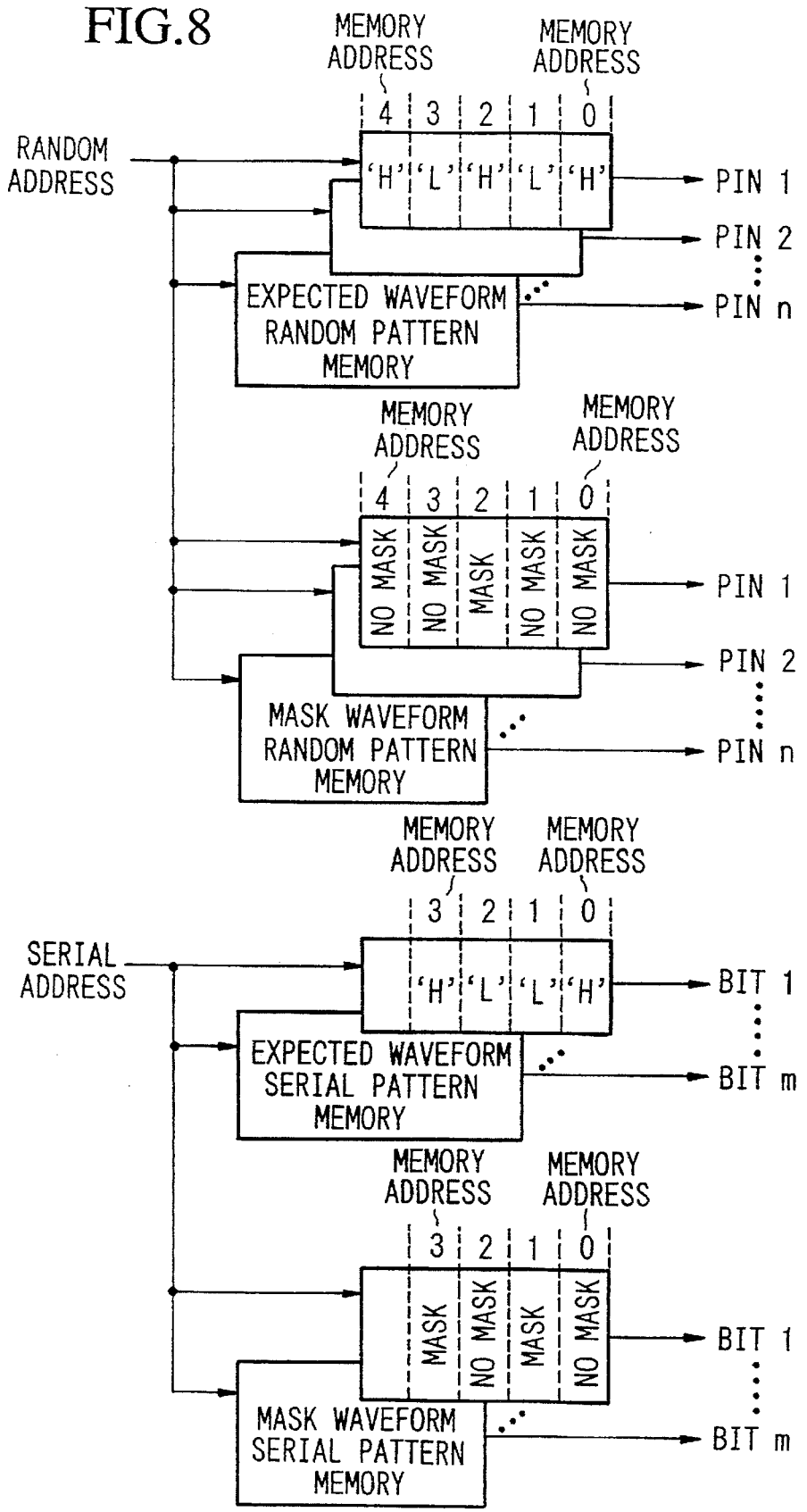
FIG. 8 shows an operation in which the waveform data read out from the random pattern memories and the serial pattern memories in the function test.
Figure 9:
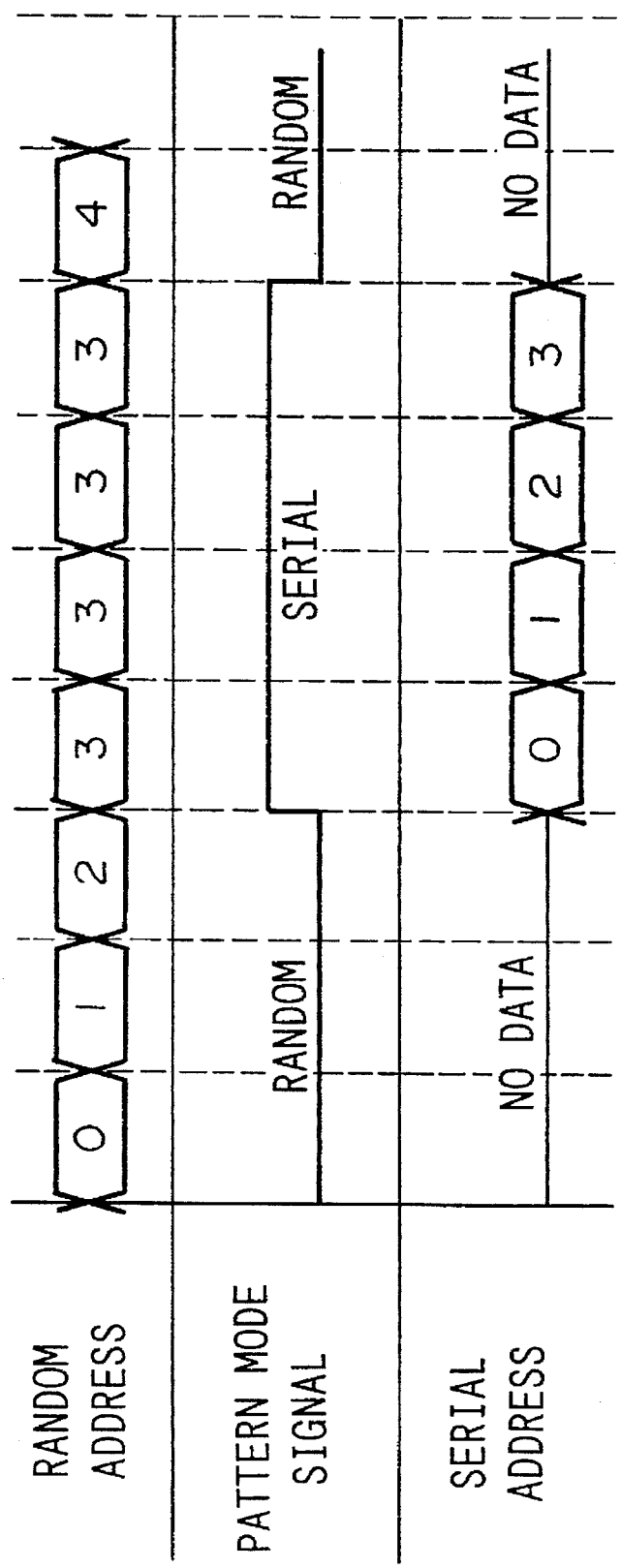
FIG. 9 is a time chart showing the operation of the conventional mask control device executing the function test.

The selector 19 shown in FIG. 5 is replaced by an inverter 24 and an AND gate 23. The inverter 24 inverts the levels of the select signals $S_1$–$S_n$. The AND gate 23 outputs the logical products of the output data of the inverter 24 and the random pattern mask waveform data $PM_1$–$PM_n$ from the mask waveform random pattern memories $13_1$–$13_n$. The logical products thus outputted are supplied to the mask control circuit 21 for the mask control of the comparison results of the comparator 20.

In this preferred embodiment, the serial mode designating signals $SP_1$–$SP_n$ are supplied to the AND gate 22 and whether or not these signals $SP_1$–$SP_n$ are outputted is controlled according to the serial pattern mask waveform data $PSM_1$–$PSM_n$ from the pin selector 17.

The select signals $S_1$–$S_n$, which are obtained through such a control, are inverted by the inverter 24 and the output data of the inverter are supplied to the AND gate 23. The AND gate 23 determines whether or not the random pattern mask waveform data $PM_1$–$PM_n$ are to be outputted, based on the output data of the inverter 24.

In general cases, if a serial pattern test is carried out on output data of the DUT corresponding to a pin k during a period, it is not necessary to use the address lines of the random pattern memory $13_k$ during the period. In this case, therefore, there is no problem in that mask data designating "mask" are stored in the random pattern memory $13_k$ as the random pattern mask waveform data corresponding to the period during which the serial pattern test is being carried out. In the preferred embodiment, mask data designating "mask" are stored in the random pattern memories $13_1$–$13_n$ for pins and periods to which serial pattern test is applied. Therefore, necessary mask waveform data can be generated by modulating these mask data based on the select signal $S_1$–$S_n$ while the serial pattern test is being carried out.

More specifically, while the serial pattern test is carried out for a pin k, the address data to the random pattern memories $13_k$ is fixed and the mask data designating "mask" is outputted from the random pattern memory. In this period, the mask waveform data corresponding to the pin k is generated by modulating the mask data based on the select signal $S_k$. In this manner, the circuit configuration for generating the serial pattern mask waveform data is simplified.

Figure 3:
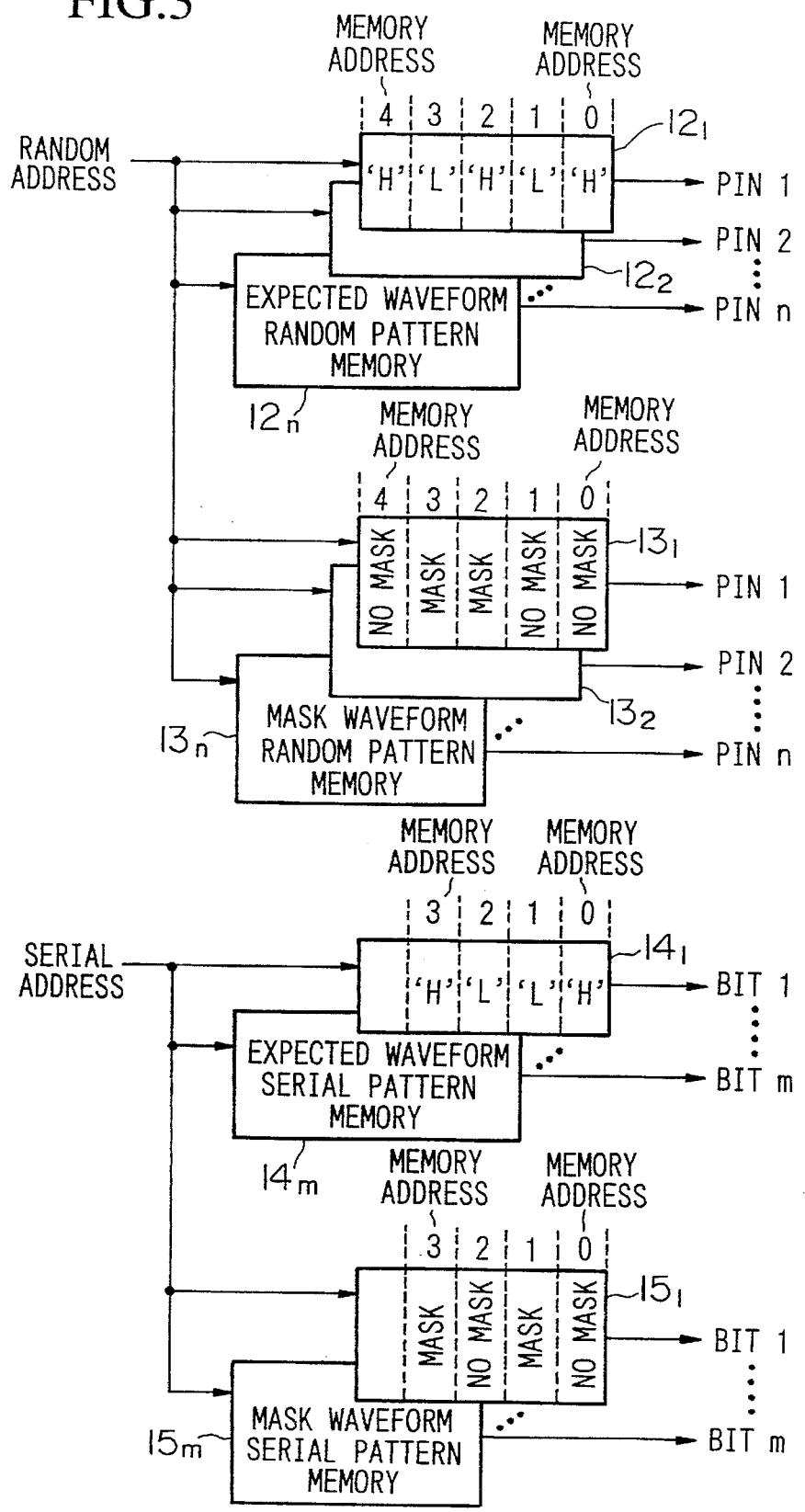
FIG. 3 shows an operation in which the waveform data read out from the random pattern memories and the serial pattern memories in the function test.
Figure 4:
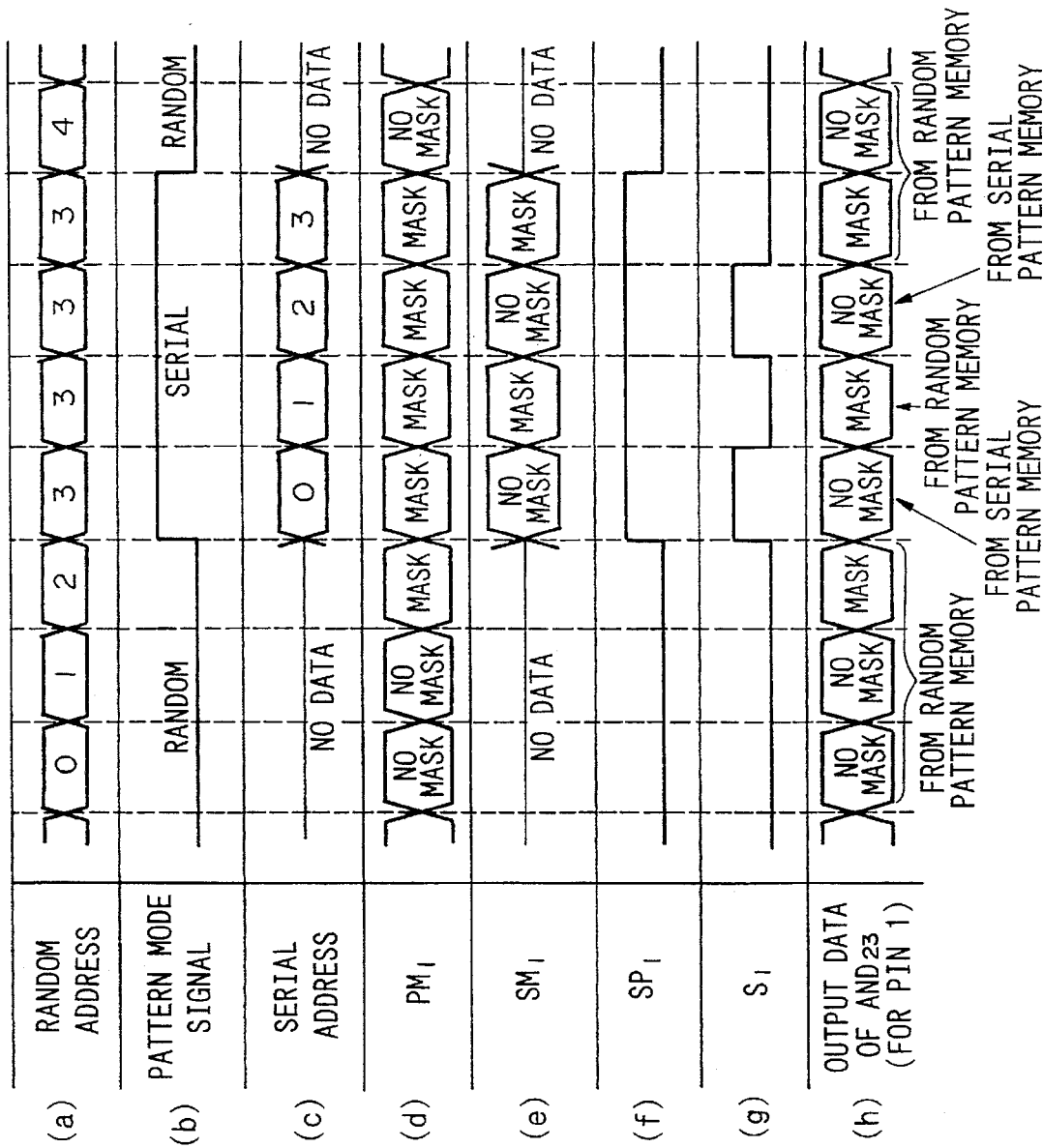
FIG. 4 is a time chart showing the operation of the mask control device executing the function test.

FIGS. 2A and 2B shows an example of waveform data which is used for a function test of a DUT which is designed according to a LSSD rule. FIG. 3 shows an operation in which the waveform data read out from the random pattern memories and the serial pattern memories in the function test. FIG. 4 is a time chart showing the operation of the mask control device executing the function test. The operation of the mask control device will be described with reference to these drawings.

FIG. 2A shows the random pattern expected waveform data, and the random pattern mask waveform data, and the address generation control command at the random addresses (0)–(4) which are programmed in the random pattern memories $12_1$ and $13_1$. In these data, the mask waveform data corresponding to the random address (3) is set to "mask". The other data shown in FIG. 2A are the same as those shown in FIG. 7A.

FIG. 2B shows the serial pattern expected and mask waveform data corresponding to the serial addresses (0)–(3). The content of these waveform data are the same as that shown in FIG. 7B.

FIG. 3 shows the random pattern memories $12_1 12_n$ and $13_1 13_n$, and the serial pattern memories $14_1$–$14_m$ and $15_1$–$15_m$, in some of which the waveform data described above are stored.

In this example, the select data are set in the pin selectors 16 and 17 so that the serial pattern waveform data $SO_1$ and $SM_1$ shown in FIG. 2B are assigned to the pin 1.

When the function test of a DUT starts, the random address, and the serial address, and the pattern mode signal are generated by the address generator 11 in real time, for example, as shown in FIG. 4.

In the example shown in FIG. 4, the pattern mode signal designating the random pattern mode is outputted by the address generator 11 while the random addresses (0)–(2) are sequentially outputted.

In this period, the random addresses (0)–(2) are sequentially supplied to the random pattern memories $12_1$–$12_n$ and $13_1$–$13_n$ which respectively store the random pattern expected waveform data and the random pattern mask waveform data as shown in FIG. 3. As a result, the random pattern expected and mask waveform data corresponding to the random address (0)–(2) are sequentially read out from the random pattern memories and the data thus read out are supplied to the pin selectors 18 and 19.

Since the pattern mode signal designates the random pattern mode, no serial mode designating signal is outputted by the pin selector 16. Therefore, n of data "L" are outputted by the AND gate 22 and the data "L" are supplied to the selector 18 as the select signals $S_1$–$S_n$.

As a result, the random pattern expected waveform data $PO_1$–$PO_n$ are selected by the selector 18 and the expected waveform data thus selected are compared with the output waveform data from the DUT by the comparator 20.

On the other hand, the select signals $S_1$–$S_n$ are inverted by the inverter 24 and the inverted select signals $S_1$–$S_n$ having "H" level are supplied to the AND gate 23. As a result, the random pattern mask waveform data $PM_1$–$PM_n$ are supplied to the mask control circuit 21 via the AND gate 23. As a result, the mask control operation using the mask wave-form data thus supplied is carried out on the comparison results obtained from the comparator 20.

In this manner, the random pattern test is carried out by using the random pattern expected and mask waveform data.

Next, the pattern mode signal is changed so as to designate the serial pattern mode. While the pattern mode signal is designating the serial pattern mode, the serial addresses (0)–(3) are sequentially supplied from the address generator 11 to the expected waveform serial pattern memories $14_1$–$14_m$ and the mask waveform serial pattern memories $15_1$–$15_m$ which respectively store the serial pattern expected waveform data and the serial pattern mask waveform data as shown in FIG. 3.

On the other hand, the random address supplied to the random pattern memories are fixed to (3) during the serial pattern mode. In this example, the mask data designating "mask" is stored as the random pattern mask waveform data at the random address (3) in the random pattern memory $13_1$. Therefore, the mask data designating "mask" is outputted from the random pattern memory 131 and the mask data is supplied to the AND gate 23 as the mask waveform data $PM_1$ during the serial pattern mode.

During the serial pattern mode, the serial pattern expected and mask waveform data corresponding to the serial addresses (0)–(3) are sequentially read out from the serial pattern memories and the data thus read out are supplied to the pin selectors 16 and 17.

The pin assigning operations as previously described are carried out on the serial pattern expected and mask waveform data based on the select data programmed and the result of the pin assigning operations are outputted as the serial pattern waveform data $PSO_1$–$PSO_n$ and $PSM_1$–$PSM_n$. Furthermore, the serial mode designating signals are outputted for the pins to which the serial pattern test are to be applied.

In this example, the serial pattern waveform data SO1 and SM1 are assigned and are outputted as the serial pattern expected and mask waveform data $PSO_1$ and $PSM_1$ by the pin selectors, and the serial mode designating signal $SP_1$ having the level "H" and corresponding to the pin 1 is outputted.

The serial pattern expected waveform data $PSO_1$–$PSO_n$ are supplied to the input port B of the selector 18.

The serial pattern mask waveform data $PSM_1$–$PSM_n$ and the serial mode designating signals $SP_1SP_n$ are supplied to the AND gate 22.

In the AND gate 22, whether or not the serial pattern mask waveform data $PSM_1$–$PSM_n$ are outputted is controlled based on the serial mode designating signals $SP_1$–$SP_n$.

In this example, the serial mode designating signal $SP_1$ having the level "H" is supplied to the AND gate 22. Therefore, the serial pattern mask data $PSM_1$ is outputted as the select signal $S_1$ via the AND gate 22. The select signals $S_1$–$S_n$ are supplied to the selector 18. The random pattern expected waveform data $PO_1$–$PO_n$ or the serial pattern expected waveform data $PSO_1$–$PSO_n$ are selected based on the select signals $S_1$–$S_n$.

When the serial pattern mask waveform data $PSM_1$ designating "no mask" is supplied from the pin selector 17 to the AND gate 22, the select signal $S_1$ having "H" level is supplied from the AND gate 22 to the selector 18 to select the serial pattern expected waveform data $PSO_1$ as the expected waveform data corresponding to the pin 1. Thus, the expected waveform data $PSO_1$ is selected by the selector 18 and is supplied to the comparator 20.

The output waveform data corresponding to the pin 1 is compared with the expected waveform data $PSO_1$ by the comparator 20 and the comparison result is supplied to the mask control circuit 21.

On the other hand, the select signal $S_1$ having "H" level is supplied to the inverter 24 and the inverted select signal having "L" level is supplied to the AND gate 23. As a result, the mask data designating "no mask" is supplied from the AND gate 23 to the mask control circuit 21 for the pin 1.

When the serial pattern mask waveform data $PSM_1$ designating "mask" is supplied from the pin selector 17 to the AND gate 22, the select signal $S_1$ having "L" level is supplied from the AND gate 22 to the selector 18.

On the other hand, the select signal $S_1$ having "L" level is supplied to the inverter 24 and the inverted select signal having "H" level is supplied to the AND gate 23. As a result, the random pattern mask waveform data $PM_1$, which designates "mask", is supplied to the mask control circuit 21 via the AND gate 23 as the mask waveform data corresponding to the pin 1.

In this manner, the random pattern mask waveform data $PM_1$ designating "mask" is modulated based on the select signal $S_1$ which reflects the serial pattern mask waveform data $PSM_1$, and the mask control for the pin 1 is carried out based on the mask waveform data obtained through such a modulation.

As described above, in this mask control device, the serial pattern expected and mask waveform data can be supplied to the comparator and the mask control circuit by a compact and simple circuit in comparative with the conventional mask control circuit.

What is claimed is:

1. A mask control device comprising:
   an address generator for generating a random pattern address, a serial pattern address, and a pattern mode signal;

an expected waveform random pattern memory for storing random pattern expected waveform data designating expected waveform data to be outputted from a device under test (DUT) in a random pattern test;

a mask waveform random pattern memory for storing random pattern mask waveform data for use in the random pattern test;

an expected waveform serial pattern memory for storing serial pattern expected waveform data designating expected waveform data to be outputted from the DUT in a serial pattern test;

a mask waveform serial pattern memory for storing serial pattern mask waveform data for use in the serial pattern test;

a first pin selector for arranging the serial pattern expected waveform data to generate serial pattern expected waveform data corresponding to tester pins and for generating serial mode designating signals designating pins to which the serial pattern test is to be applied;

a second pin selector for arranging the serial pattern mask waveform data to generate serial pattern mask waveform data corresponding to the tester pins;

a selector for selecting the random pattern expected waveform data or the serial pattern expected waveform data generated by the first pin selector based on the serial mode designating signals;

a comparator for comparing output waveform data obtained from the DUT with the random pattern expected waveform data or the serial pattern expected waveform data selected by the selector;

a logical operation circuit comprising
a first AND gate for outputting logical products of the serial mode designating signals and the serial pattern mask waveform data corresponding to the tester pins as select signals,
an inverter for inverting the select signals, and
a second AND gate for modulating the random pattern mask waveform data based on the inverted select signals from the inverter to generate mask waveform data; and a mask control circuit for carrying out a mask control of a comparison result of the comparator using the mask waveform data generated by the logical operation circuit.

2. A mask control device according to claim 1 wherein mask data designating a mask operation are stored in the mask waveform random pattern as the random pattern mask waveform data which are to be outputted from the mask waveform random pattern memory during the serial pattern test.

* * * * *